(12) United States Patent
Abdelaal et al.

(10) Patent No.: US 12,088,324 B2
(45) Date of Patent: Sep. 10, 2024

(54) EXCESS LOOP DELAY COMPENSATION FOR A DELTA-SIGMA MODULATOR

(71) Applicant: Infineon Technologies AG, Neubiberg (DE)

(72) Inventors: Ahmed Abdelaal, Ulm (DE); John G. Kauffman, Neu-Ulm (DE); Maurits Ortmanns, Ulm (DE); Takashi Miki, Neu-Ulm (DE)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 17/820,975

(22) Filed: Aug. 19, 2022

(65) Prior Publication Data

US 2024/0063812 A1 Feb. 22, 2024

(51) Int. Cl.
*H03M 3/00* (2006.01)

(52) U.S. Cl.
CPC ........... *H03M 3/344* (2013.01); *H03M 3/372* (2013.01); *H03M 3/422* (2013.01); *H03M 3/436* (2013.01); *H03M 3/464* (2013.01)

(58) Field of Classification Search
CPC ...... H03M 3/344; H03M 3/372; H03M 3/422; H03M 3/436; H03M 3/464; H03M 3/424; H03M 3/43; H03M 3/454
See application file for complete search history.

(56) References Cited

U.S. PATENT DOCUMENTS

| | | | | |
|---|---|---|---|---|
| 6,909,394 | B2 * | 6/2005 | Doerrer | H03M 3/37 |
| | | | | 341/200 |
| 11,394,395 | B1 * | 7/2022 | Zhang | H03M 3/424 |
| 2016/0380646 | A1 * | 12/2016 | Kauffman | H03M 1/0607 |
| | | | | 341/118 |
| 2017/0063388 | A1 * | 3/2017 | Kauffman | H03M 1/1009 |
| 2018/0343013 | A1 * | 11/2018 | Breems | H03M 3/496 |
| 2021/0184691 | A1 * | 6/2021 | Tripathi | H03M 3/424 |

OTHER PUBLICATIONS

Altun, Oguz et al., "A 1.5V Multirate Multibit Sigma Delta Modulator for GSM/WCDMA in a 90 nm digital CMOS Process", Presented to The Academic Faculty, Georgia Institute of Technology, Apr. 2005, 116 pages.
Benabes, Philippe et al., "A Methodology for designing Continuous-time Sigma-Delta Modulators", IEEE Proceedings European Design and Test Conference, ED & TC 97, France, Mar. 17-20, 1997, 5 pages.

(Continued)

*Primary Examiner* — Jean B Jeanglaude
(74) *Attorney, Agent, or Firm* — Slater Matsil, LLP

(57) ABSTRACT

In accordance with an embodiment, a delta-sigma modulator includes: an analog loop filter comprising an outer portion and an inner portion having an input coupled to the outer portion; a quantizer coupled to an output of the inner portion of the analog loop filter; an outer feedback path coupled between an output of the quantizer and an input to the outer portion of the analog loop filter; and a compensation filter coupled between an output of the quantizer and an input of the inner portion of the analog loop filter. The compensation filter has a transfer function configured to correct for an effect of excess loop delay (ELD) on the delta-sigma modulator.

20 Claims, 10 Drawing Sheets

(56) References Cited

OTHER PUBLICATIONS

Brandt, B. P., et al., "Second-order sigma-delta modulation for digital-audio signal acquisition," IEEE Journal of Solid-State Circuits, vol. 26, No. 4, Apr. 1991, pp. 618-627.
Colodro, Francisco et al., "New Continuous-Time Multibit Sigma-Delta Modulators With Low Sensitivity to Clock Jitter", IEEE Transactions on Circuits and Systems—I: Regular Papers, vol. 56, No. 1, Jan. 2009, 10 pages.
Hu, Yue et al., "A Continuous-Time ΔΣ ADC Utilizing Time Information for Two Cycles of Excess Loop Delay Compensation", IEEE Transactions on Circuits and Systems—II: Express Briefs, vol. 62, No. 11, Nov. 2015, 5 pages.
Keller, Matthais et al., "A Comparative Study on Excess-Loop-Delay Compensation Techniques for Continuous-Time Sigma-Delta Modulators", IEEE Transactions on Circuits and Systems—I: Regular Papers, vol. 55, No. 11, Dec. 2008, 8 pages.
Mitteregger, G., et al., "A 14b 20mW 640MHz CMOS CT ΔΣ ADC with 20MHz Signal Bandwidth and 12b ENOB", ISSCC 2006 / Session 3 / Oversampling ADCs / 3.1, IEEE International Solid-State Circuits Conference, Germany, Feb. 6, 2006, 10 pages.
Oliaei, Omid et al., "Sigma-Delta Modulator With Spectrally Shaped Feedback", IEEE Transactions on Circuits and Systems—II: Analog and Digital Signal Processing, vol. 50, No. 9, Sep. 2003, 13 pages.
Pakniat, Hossein et al., "A ΣΔ-FIR-DAC for Multi-Bit ΣΔ Modulators", IEEE Transactions on Circuits and Systems—1: Regular Papers, vol. 60, No. 9, Sep. 2013, 12 pages.
Pavan, S., "Systematic Design Centering of Continuous Time Oversampling Converters," in IEEE Transactions on Circuits and Systems 11: Express Briefs, vol. 57, No. 3, Mar. 2010, pp. 158-162.
Redman-White, W. et al., "Improved Dynamic Linearity in Multi-Level Sigma-Delta Converters by Spectral Dispersion of D/A Distortion Products", European Conference on Circuit Theory and Design, University of Southampton, UK, Sep. 5-8, 1989, 4 pages.
Risbo, Lars et al., "Digital Approaches to ISI-Mitigation in High-Resolution Oversampled Multi-Level D/A Converters", EEE Journal of Solid-State Circuits, vol. 46, No. 12, Dec. 2011, 12 pages.
Singh, Vikas et al., "A 16MHz BW 75dB DR CT DS ADC Compensated for More Than One Cycle Excess Loop Delay", IEEE Journal of Solid-State Circuits, vol. 47, Issue 8, Aug. 2012, 4 pages.
Su, David K., et al., "A CMOS Oversampling D/A Converter with a Current-Mode Semi-Digital Reconstruction Filter", ISSCC 93 / Session 14/ Oversampled Converters / Paper FA 14.3, IEEE International Solid-State Circuits Conference, Feb. 26, 1993, 2 pages.
Vadipour, Morteza et al., "A 2.1mW/3.2mW Delay-Compensated GSM/WCDMA ΣΔ Analog-Digital Converter", IEEE 2008 Symposium on VLSI Circuits Digest of Technical Papers, US, Jun. 18-20, 2008, 2 pages.
Wagner, J., et al., "Using www.sigma-delta.de to rapidly obtain ELD compensated CT ΣΔ modulators," IEEE International Symposium on Circuits and Systems (ISCAS), May 22-25, 2016, pp. 1498-1501.

\* cited by examiner

EXCESS LOOP DELAY COMPENSATION FOR A DELTA-SIGMA MODULATOR

TECHNICAL FIELD

The present invention relates generally to a system and method for an electronic system, and, in particular embodiments, to excess loop delay compensation for a delta-sigma modulator.

BACKGROUND

Delta-sigma analog-to-digital converters (ADCs) are commonly used in many electronic applications due to their good signal to noise and distortion ratio (SNDR) and their relaxed performance requirements on analog circuits. A delta-sigma ADC includes a delta-sigma modulator, which includes a loop filter followed by a quantizer and a digital-to-analog converter (DAC) arranged in a feedback loop. The delta-sigma modulator is oversampled by a sufficiently high oversampling ratio, such that the quantization noise generated by the quantizer is pushed to higher out of band frequencies by the action of the feedback loop, which leaves a very high dynamic range for the in-band signal. In many applications, the higher frequency quantization noise is digitally filtered and the high sampling rate of the data output by the modulator is reduced using a decimation filter.

There are generally two types of delta-sigma modulators: a discrete-time delta-sigma modulator having a discrete-time loop filter, and a continuous-time delta-sigma modulator having a continuous-time loop filter. Continuous-time delta-sigma modulators offer some advantages over discrete-time delta-sigma modulators including increased power efficiency, and inherent anti-alias filtering that reduces or eliminates the need for an external anti-aliasing filter, which makes them particularly well-suited for high-frequency and power sensitive systems, such as wireless systems. However, continuous-time delta-sigma converters present some design challenges including sensitivity to clock jitter, and sensitivity to quantizer delay.

SUMMARY

In accordance with an embodiment, a delta-sigma modulator includes: an analog loop filter comprising an outer portion and an inner portion having an input coupled to the outer portion; a quantizer coupled to an output of the inner portion of the analog loop filter; an outer feedback path coupled between an output of the quantizer and an input to the outer portion of the analog loop filter; and a compensation filter coupled between an output of the quantizer and an input of the inner portion of the analog loop filter. The compensation filter has a transfer function configured to correct for an effect of an outer excess loop delay (ELD) and an inner ELD on the delta-sigma modulator; the outer ELD comprises a delay from the input of the quantizer to the input of the outer portion of the analog loop filter including the outer feedback path, and the inner ELD comprises a delay from the input to the quantizer to the input of the inner portion of the analog loop filter including at least a portion of the outer feedback path; the inner ELD is less than one clock cycle of the delta-sigma modulator, and the outer ELD is at least two clock cycles of the delta-sigma modulator.

In accordance with another embodiment a circuit includes a delta-sigma modulator. The delta-sigma modulator includes: an analog loop filter of order n that includes a first analog loop filter portion having an order n1 of between 1 and p, wherein p is an integer of at least one and of at most n, and a second analog loop filter portion having an input coupled to an output of the first analog loop filter portion, the second analog loop filter portion having an order of p-n. The delta-sigma modulator further includes a quantizer coupled to an output of the second analog loop filter portion, the quantizer having a first excess loop delay (ELD) and configured to provide a quantized sample every sampling period; an inner loop portion coupled between an output of the quantizer and an input of the second analog loop filter portion, the inner loop portion having an second ELD, the inner loop portion comprising a finite impulse response (FIR) filter and a first digital-to-analog converter (DAC) coupled between an output of the FIR filter and the input of the second analog loop filter portion; a functional circuit coupled between the output of the quantizer and an input of the first analog loop filter portion, and a second DAC having an input coupled to the output of the functional circuit and an output coupled to an input of the first analog loop filter portion, wherein the second DAC and the functional circuit have a third ELD, a sum of the first ELD and the second ELD is not larger than one clock cycle of the delta-sigma modulator, and the third ELD is larger than one clock cycle of the delta-sigma modulator. The FIR filter is configured to correct for an effect of the first ELD, the second ELD, and the third ELD on a noise transfer function of the delta-sigma modulator.

In accordance with a further embodiment, a method of operating a delta-sigma modulator includes filtering an analog input signal using an analog loop filter, where the analog loop filter comprises an outer portion, and an inner portion coupled to an output of the inner portion; quantizing an output of the inner portion of the analog loop filter to form a quantized signal using a quantizer; feeding back the quantized signal to an input of the outer portion of the analog loop filter via an outer feedback path; filtering the quantized signal to form a filtered signal using a compensation filter; and feeding back the filtered signal to an input of the inner portion of the analog loop filter. The compensation filter has a transfer function configured to correct for an effect of an outer excess loop delay (ELD) and an inner ELD on the delta-sigma modulator; the outer ELD comprises a delay from the input of the quantizer to the input of the outer portion of the analog loop filter including the outer feedback path, and the inner ELD comprises a delay from the input to the quantizer to the input of the inner portion of the analog loop filter including at least a portion of the outer feedback path; the inner ELD is less than one clock cycle of the delta-sigma modulator; and the outer ELD is at least two clock cycles of the delta-sigma modulator.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
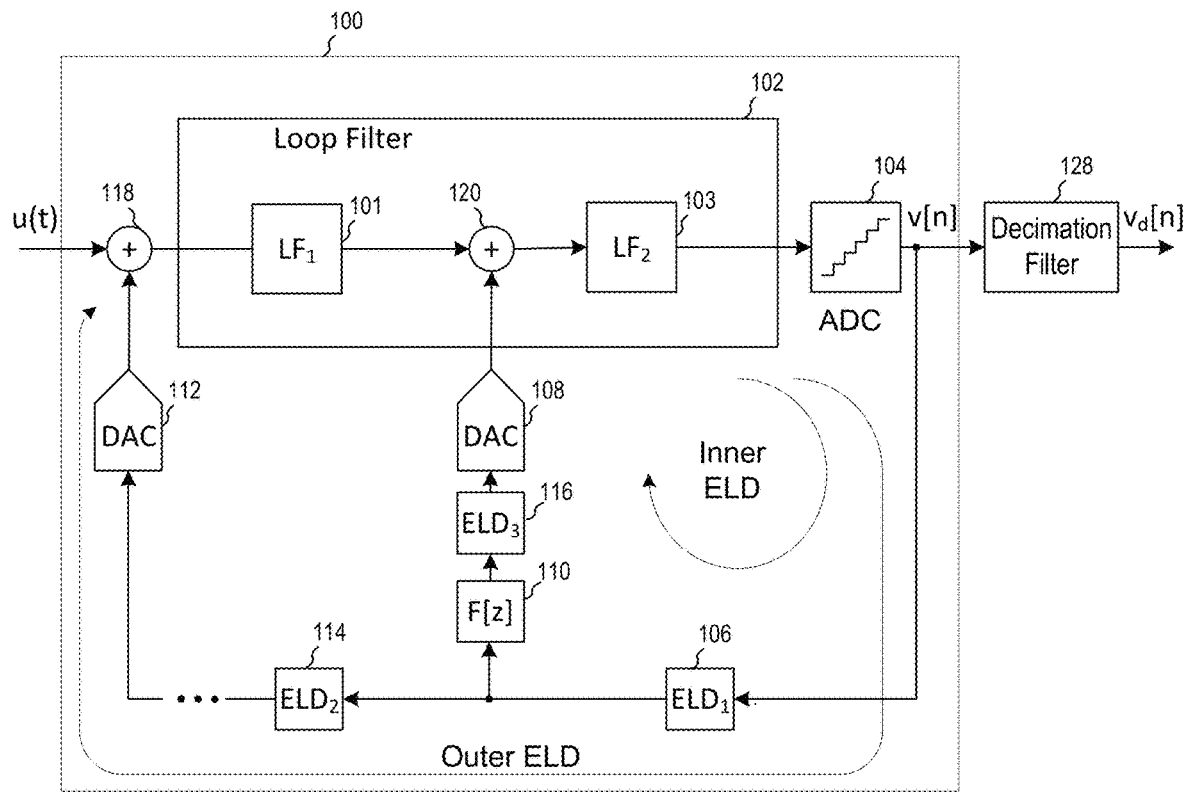
FIGS. 1A and 1B illustrate a delta-sigma modulator according to an embodiment.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Excess loop delay (ELD), which is the additional delay in a feedback loop, is a phenomenon that affects delta-sigma modulators, and especially continuous-time delta-sigma modulators. ELD due to quantizer delay, and the delay of other loop components such as digital-to-analog converters (DACs) in the feedback path of a delta-sigma modulator can degrade the performance of the delta-sigma modulator. For example, the presence of ELD can reduce the maximum stable amplitude of the modulator, can make the modulator more sensitive to semiconductor process variations, may increase the amplitude of internal signal swings, and degrade the noise transfer function, which reduces the maximum achievable signal to quantization noise ratio (SQNR) of the modulator. ELD can also limit the ability to apply various linearity and performance enhancement techniques to the modulator because of the destabilizing effects of circuit of the excess time delay associated with these techniques.

In accordance with an embodiment, a continuous-time delta-sigma modulator includes a continuous-time loop filter, a quantizer coupled to an output of the continuous-time loop filter, and feedback paths that each include a digital-to-analog converters (DACs) coupled between an output of the quantizer and various points within the continuous-time loop filter. A compensation filter is coupled between the output of the quantizer and the input of one of the DACs. The transfer function of the compensation filter is selected to compensate for the effects of excess loop delay (ELD) in the outermost feedback path including the excess loop delay of the quantizer.

In some embodiments, compensating for the effect of excess loop delay advantageously allows the transfer function of the continuous-time delta-sigma modulator to substantially match an ideal transfer function; and improves the stability of the continuous-time modulator. Compensating for the effect of excess loop delay also relaxes the delay requirements of the quantizer and other circuits present in the feedback paths. For example, longer delay can be tolerated in the quantizer which allows for reduced power consumption. Moreover, the ability to have longer delay in the feedback paths allows for the power efficient implementation of feedback circuits such as pipelined dynamic element mismatch (DEM) circuits, digital delta-sigma modulators circuits, jitter filters, and intersymbol interference (ISI) compensation circuits. In some embodiments, ELD in discrete-time delta-sigma modulators can also be compensated.

FIG. 1A illustrates a block diagram of a delta-sigma modulator 100 according to an embodiment of the present invention. As shown, delta-sigma modulator 100 includes analog loop filter 102, quantizer 104, digital-to-analog converters 108 and 112, and compensation filter 110. Analog loop filter 102 includes a first analog loop filter portion 101 followed by second analog loop filter portion 103. First analog loop filter portion 101 may also be referred to as an "outer portion" of the analog loop filter, and second analog loop filter portion 103 may also be referred to as an "inner portion" of the analog loop filter. The output of DAC 112 is coupled to summer 118 coupled to the input of analog loop filter 102, and the output of DAC 108 is coupled to summer 120 that provides a sum of the output of first analog loop filter portion 101 and the output of DAC 108 to the input of second analog loop filter portion 103. In various embodiments, first analog loop filter portion 101 has an order of n1 of between 1 and p, where p is an integer of at least one and of at most n, while second analog loop filter portion 103 has an order of p-n. In some embodiments, second analog loop filter portion 103 could have an order of zero.

Quantizer 104 monitors the output of loop filter 102 and provides a quantized sample every sampling period. In some embodiments, quantizer 104 is a multi-bit quantizer that may be implemented using ADC circuits known in the art, such as a flash ADC. Alternatively, quantizer 104 is a single-bit quantizer implemented, for example, using a comparator.

Analog loop filter 102 including first analog loop filter portion 101 and second analog loop filter portion 103 may be implemented using continuous-time analog filter circuits, or discrete-time analog filter circuits. Continuous-time analog filter circuits may include, for example, active or passive continuous-time filter elements and may include one or more continuous-time integrators. Discrete-time filter circuits may be implemented, for example, using switched-capacitor circuits or switched-current circuits.

As shown, delta-sigma modulator 100 has an inner loop and an outer loop. The inner loop is formed by quantizer 104, compensation filter 110, DAC 108, and second analog loop filter portion 103. For the purpose of explanation, the inner loop can also be considered to have an "inner feedback path" that includes feedback components such as compensation filter 110 and DAC 108 that are coupled to, but do not include second analog loop filter portion 103 and quantizer 104. The outer loop includes quantizer 104, DAC 112, first analog loop filter portion 101 and second analog loop filter portion 103. For the purpose of explanation, the inner loop can also be considered to have an "outer feedback path" that includes feedback components such as DAC 112 that are coupled to, but do not include first and second analog loop filter portion 101 and 103 and quantizer 104. While only two loops are shown in the example of FIG. 1A for simplicity of illustration, the inner loop and/or outer loop may contain more than one loop as discussed below with respect to FIGS. 2A, 2B, 2C and 2D.

As shown in FIG. 1A, the ELD of the various components are modeled by ELD blocks 106, 114 and 116.

ELD$_1$ depicted by ELD block 106 represents the ELD caused by the delay of quantizer 104, ELD$_2$ depicted by ELD block 114 represents the ELD caused by DAC 112 and other components, such as one or more functional circuits, coupled to DAC 112 in the outer feedback path, and ELD$_3$ depicted by ELD block represents delay of DAC 108, compensation filter 110 and other additional blocks in the inner feedback path. As such, an "inner ELD" of the inner loop is the sum of ELD$_1$ and ELD$_3$, while an "outer ELD" of the outer loop of the sum of ELD$_1$ and ELD$_2$.

In various embodiments, compensation filter 110 has a transfer function that compensates for the effect of the inner ELD and the outer ELD on the noise transfer function of delta-sigma modulator 100. For example, given a noise transfer function of delta-sigma modulator 100 assuming zero ELD, compensation filter 110 may include filter coefficients that are selected to restore the noise transfer function to be the same as the non-zero ELD case. In the embodiments described herein, compensation filter 110 may compensate for an inner ELD of up to one sampling delay, and for an outer ELD of two sampling delays and greater. In some embodiments, the compensation filter 110 may be configured to compensate for an outer ELD of less than two sampling delays.

In some embodiments, the transfer function F[z] of filter 110 is derived by equating the noise transfer function of delta-sigma modulator 100 including the non-zero ELD of ELD blocks 106, 114 and 116, with an ideal noise transfer function of delta-sigma modulator 100 with the ELD of ELD blocks 106, 114, and 116 set to zero and filter 110 removed.

In some embodiments, a decimation filter 128 may be coupled to the output of delta-sigma modulator 100 in order to reduce the sample rate of the modulator output and increase the bit width of the output. Decimation filter 128 may be implemented, for example, using decimation filter architectures known in the art. For example, decimation filter 128 may include a comb filter implemented using a cascade of accumulators followed by a cascade of difference circuits. An infinite impulse response (IIR) filter or a finite impulse response (FIR) filter may also be used to provide further filtering. Alternatively, other filter structures may be used.

Figure 1B:
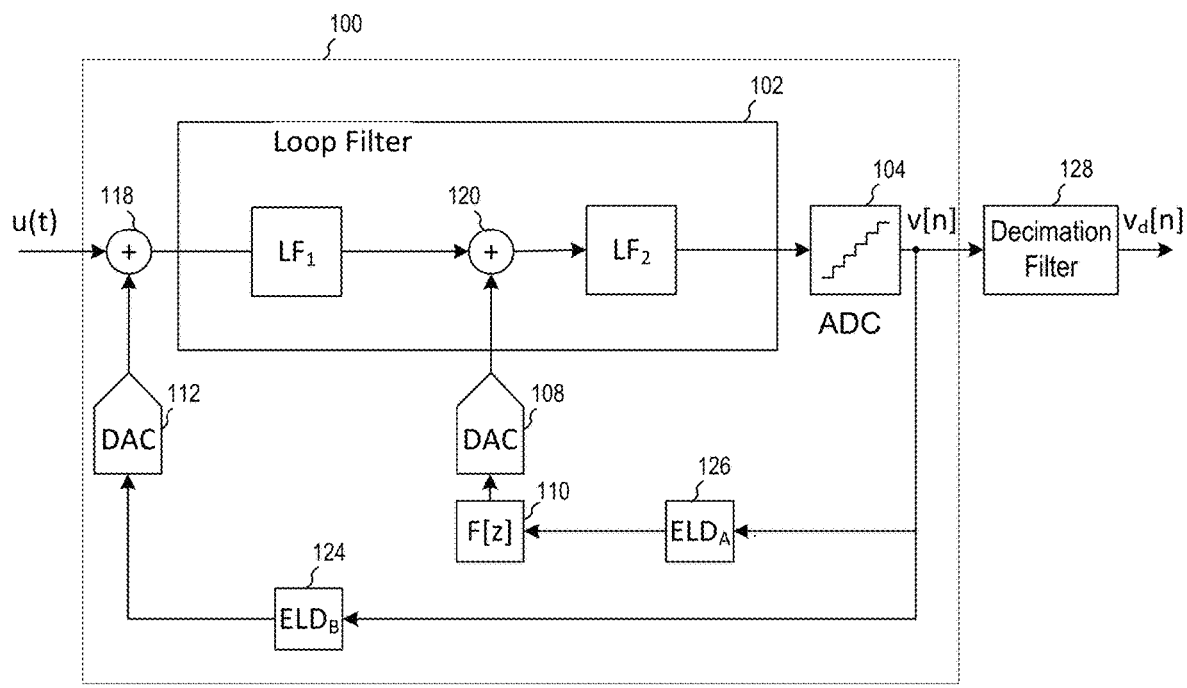

FIG. 1B illustrates another representation of delta-sigma-modulator in which the inner loop and outer loop are represented as two independent loops. As shown, the ELD of the inner loop is represented as ELD$_A$ with respect to ELD block 126, and the ELD of the outer loop is represented as ELD$_B$ with respect to ELD block 124. It should be understood that the representations of FIGS. 1A and 1B may be used to represent the same physical structure.

Figure 1C:
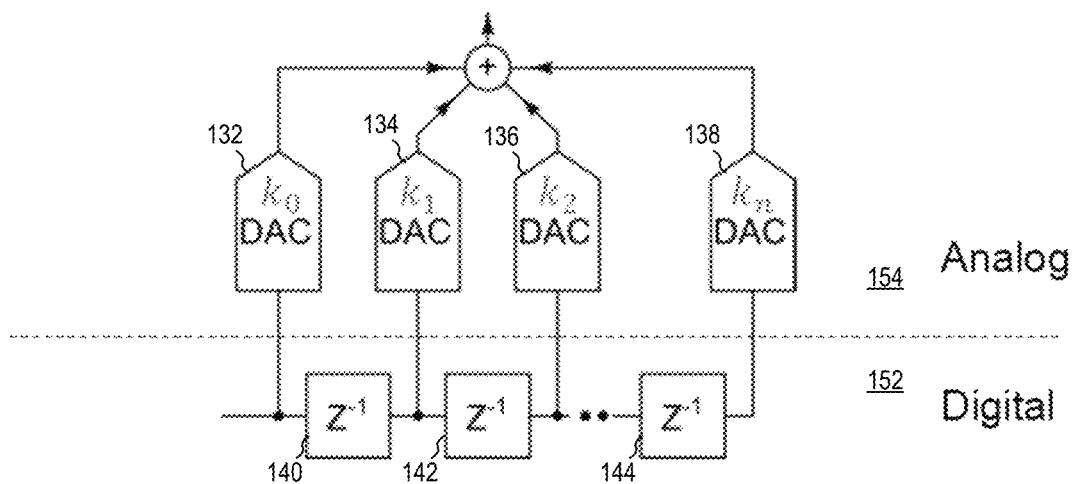
FIG. 1C illustrates an implementation of a FIR filter and a plurality of DACs according to an embodiment.

Filter 110 can be implemented using a variety of different digital filter structures known in the art. For example, in some embodiments, filter 110 may be implemented using a finite impulse response (FIR) filter. FIG. 1C illustrates one way of implementing such a FIR filter in the context of delta-sigma modulator 100 illustrated in FIGS. 1A and 1B.

Filter structure 130 shown in FIG. 1C performs the functions of both compensation filter 110 and DAC 108 and includes both a digital portion 152 and an analog portion 154. The digital portion 152 includes unit delay blocks 140, 142 and 144 that may be implemented, for example, using clocked registers. Analog portion 154 includes DACs 132, 134, 136 and 138 having corresponding weights $k_0$, $k_1$, $k_2$ ... $k_n$. In embodiments, filter structure 130 may utilize any number of delay blocks or DACs depending on the required transfer function. In the depicted embodiment, filter structure 130 has a transfer function of:

$$F[z]=k_0z^0+k_1z^{-1}+k_2z^{-2}+k_3z^{-3}+k_nz^{-n}.$$

Using filter structure 130 is advantageous in that a high level of linearity can be achieved during operation of delta-sigma modulator 100. For example, in embodiments in which quantizer 104 is a single-bit quantizer, DACs, 132, 134, 136 and 138 may be implemented using single-bit DACs, which are inherently linear.

In some embodiments, the filter length n is at least the number of clock periods of ELD modeled by ELD$_2$ of block 114 in the outer portion of the outer loop in order to provide degrees of freedom in the derivation of the transfer function of compensation filter 110.

Figure 2A:
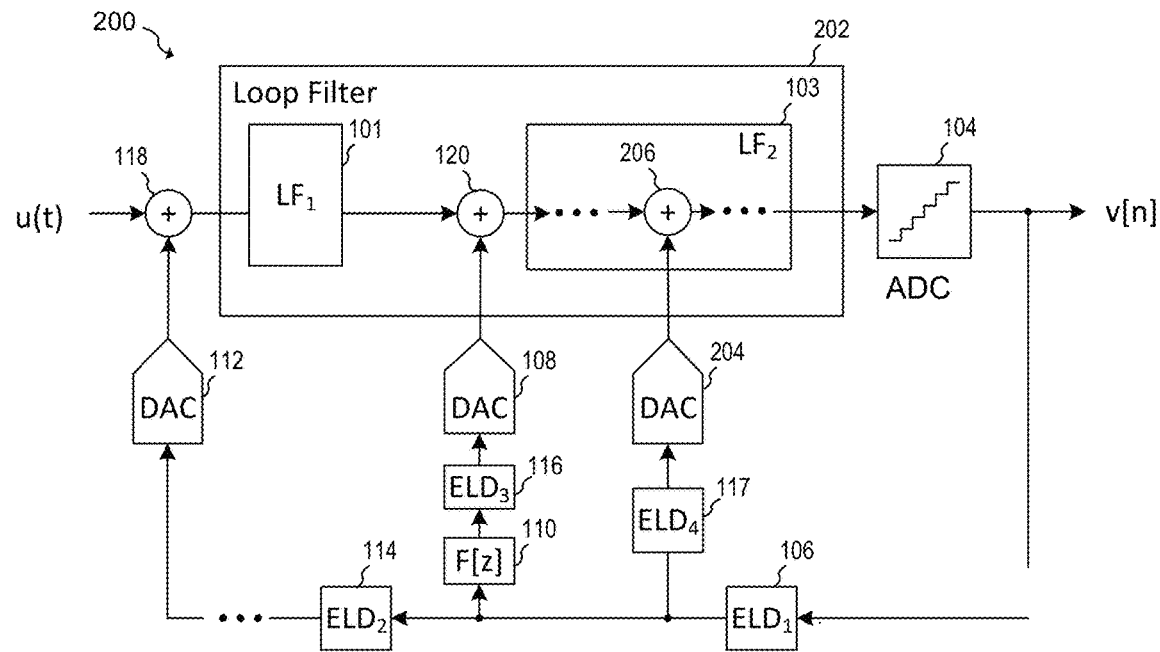
FIGS. 2A, 2B, 2C and 2D illustrate delta-sigma modulators according to embodiments of the present invention.

FIGS. 2A-2D illustrate various delta-sigma modulator configurations according to embodiments of the present invention. For example, FIG. 2A illustrates an embodiment delta-sigma modulator that is similar to delta-sigma modulator 100 shown in FIG. 1A, with the exception that an additional inner feedback branch including DAC 204 is coupled between the output of quantizer 104 and a second input of second analog loop filter portion 103. As shown the second input of analog loop filter portion 103 is coupled to summer 206 that sums the output of previous filtering stages of second analog loop filter portion 103 of analog loop filter 202, and provides the summed output to later stages of second analog loop filter portion 103. In some embodiments, the output of summer 206 is directly coupled to the input of quantizer 104. As shown, ELD block 117 represents the ELD of DAC 204 and any additional ELD within the feedback branch coupled between the output of ELD block 106 and summer 206. ELD block 116 represents the ELD of DAC 108, as well as the ELD of compensation filter 110.

While compensation filter 110 is shown coupled to the input of DAC 108, it should be understood that compensation filter 110 may be located in any single inner loop branch, or distributed among two or more inner loop branches. For example, in alternative embodiments, compensation filter 110 may be coupled to the input of DAC 204 and/or a second compensation filter may be coupled to the input of DAC 204 in addition to compensation filter 110 coupled to the input of DAC 108.

Figure 2B:
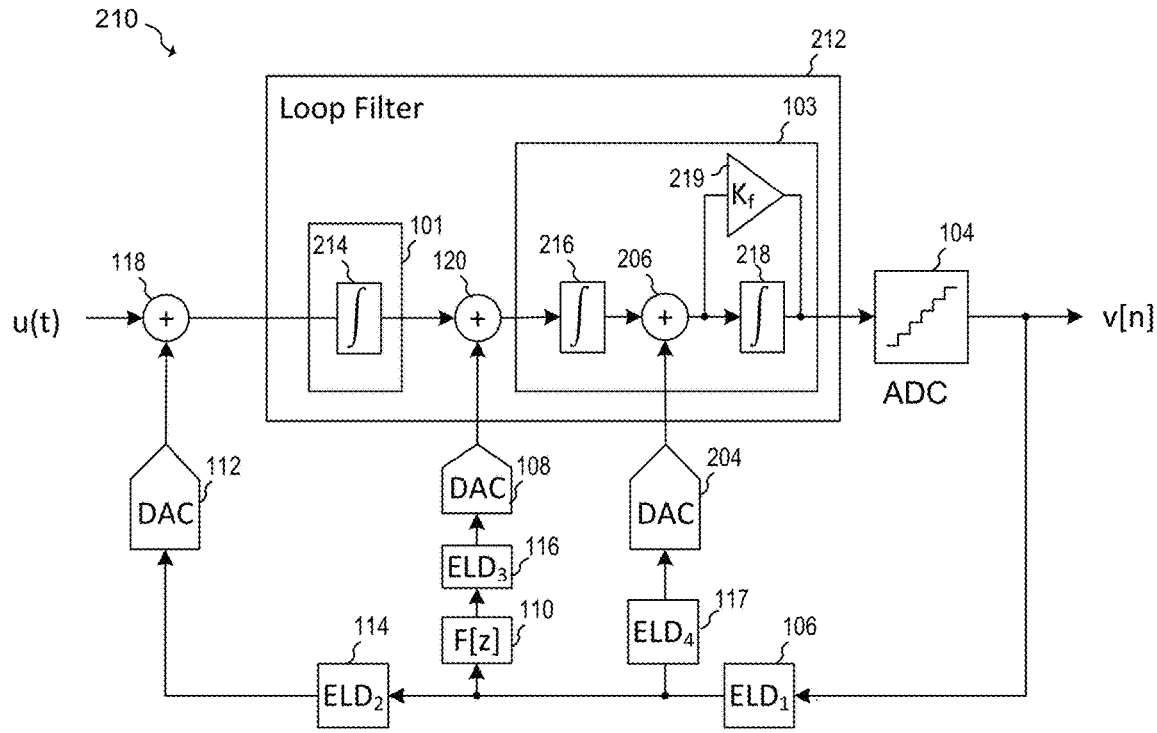

FIG. 2B illustrates an embodiment third-order delta-sigma modulator 210, which is a specific example of modulator 200 shown in FIG. 2A. First analog loop filter portion 101 of analog loop filter 212 includes an integrator 214, and second analog loop filter portion 103 includes integrator 216 coupled between summer 120 and 206, and a proportional integrator that includes integrator 218 in parallel with feedforward block 219 coupled between summer 206 and quantizer 104. Feedforward block may be implemented using an amplifier or circuit configured to form a feedforward path.

Figure 2C:
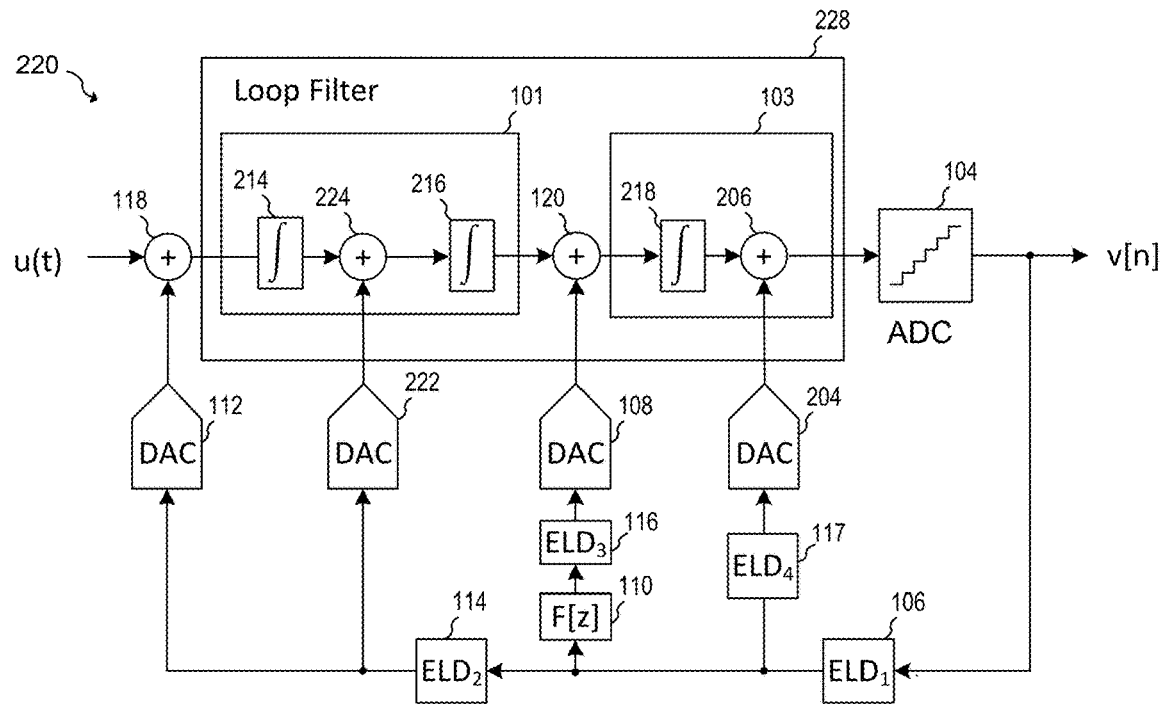

FIG. 2C illustrates an embodiment third-order delta-sigma modulator 220, in which both the inner loop and the outer loop include two respective feedback paths. As shown, first analog loop filter portion 101 of analog loop filter 228 includes integrators 214 and 216 and summer 224 coupled between integrators 214 and 216. Second analog loop filter portion 103 includes integrator 218 coupled between summer 120 and 206. The outer loop includes DAC 112 having an output coupled to summer 118, and DAC 222 having an output coupled to summer 224 of first analog loop filter portion 101 via a second input to first analog loop filter portion 101. The inner loop has a portion that includes compensation filter 110 and DAC 108 having an output coupled to summer 120, and an innermost feedback path that includes DAC 204 having an output coupled to summer 206 via the last input of the inner portion 103 of the analog loop filter. ELD block 114 represents the ELD of an outer portion of the outer loop including the ELD of DACs 112 and 222 and other components coupled within the outer portion of the outer loop.

Figure 2D:
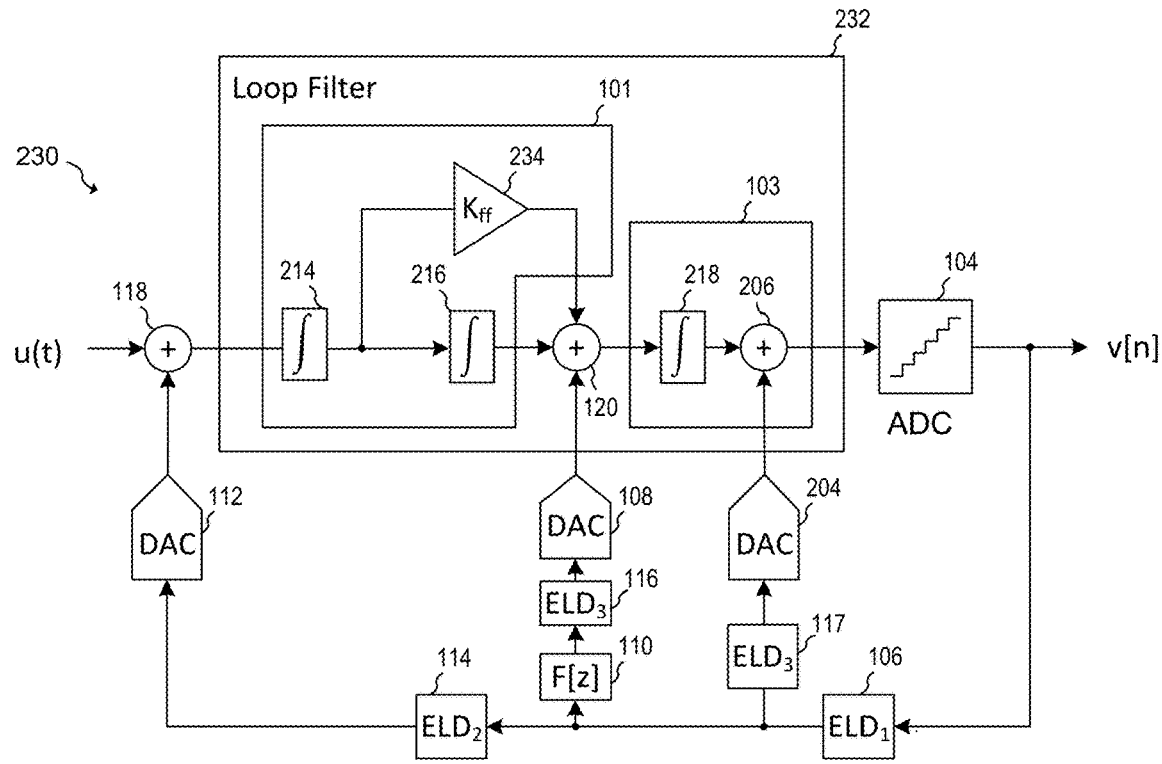

FIG. 2D illustrates an embodiment third-order delta-sigma modulator 230 implemented as a continuous-time delta-sigma modulator having a cascade of integrators with distributed feedback (CIFB) and a feed-forward branch. First analog loop filter portion 101 of analog loop filter 232 includes integrators 214 and 216 and feed-forward amplifier 234 coupled between the output of integrator 214 and summer 120. As shown, feed-forward amplifier has a gain of $K_{ff}$. Second analog loop filter portion 103 includes integrator 216 coupled between summer 120 and 206, and integrator 218.

In various embodiments, the integrators shown in FIGS. 2B, 2C and 2D may be implemented using continuous-time integrators circuits known in the art, such as capacitively loaded transconductance amplifiers or operational amplifier-based integrators. Feed-forward amplifier 234 shown in FIG. 2D may be implemented using amplifier circuits known in the art, such as a resistively loaded transconductance amplifier or an operational amplifier with resistive feedback. In continuous-time loop filter implementations, the function of feed-forward amplifier 234 may also be implemented using a resistor coupled between the output of integrator 214 and a virtual ground of integrator 218.

In alternative embodiments that utilize discrete-time loop filters, the integrators shown in FIGS. 2B, 2C and 2D may be implemented using switched capacitor integrator circuits known in the art. In such discrete-time embodiments, feed-forward amplifier 234 shown in FIG. 2D may be implemented using a switched capacitor amplifier circuit known in the art.

It should also be understood that the loop filter architectures described above with respect to FIGS. 2A-2D are just a few examples of many possible loop filter topologies. In alternative embodiments, other modulator topologies and/or other loop filter structures could be used. In some embodiments, loop filter may include a cascade of integrators or resonators. The cascade of resonators or integrators may include distributed feedback paths, feed-forward paths, or a combination of distributed feedback paths and feed-forward paths.

As mentioned above, the ability to compensate for large ELDs in the outer loop allows for circuits with large delays to be disposed in the outer loop of a delta-sigma modulator without degrading the noise transfer function of the delta-sigma modulator. FIGS. 3A-3C, 4 and 5 illustrate embodiment delta-sigma modulator systems that accommodate circuitry having a finite processing time in its feedback loop. While the examples of FIGS. 3A-3C, 4 and 5 show these systems in the context of the delta-sigma modulator structure described above with respect to FIG. 1A, it should be understood that any embodiment delta-sigma modulator could be adapted to incorporate similar circuitry in its outer feedback loop. For example, the embodiment examples of FIGS. 2A-2D could be adapted to incorporate circuitry in its outer feedback loop in a similar manner as FIGS. 3A-3C, 4 and 5 described below.

Figure 3A:
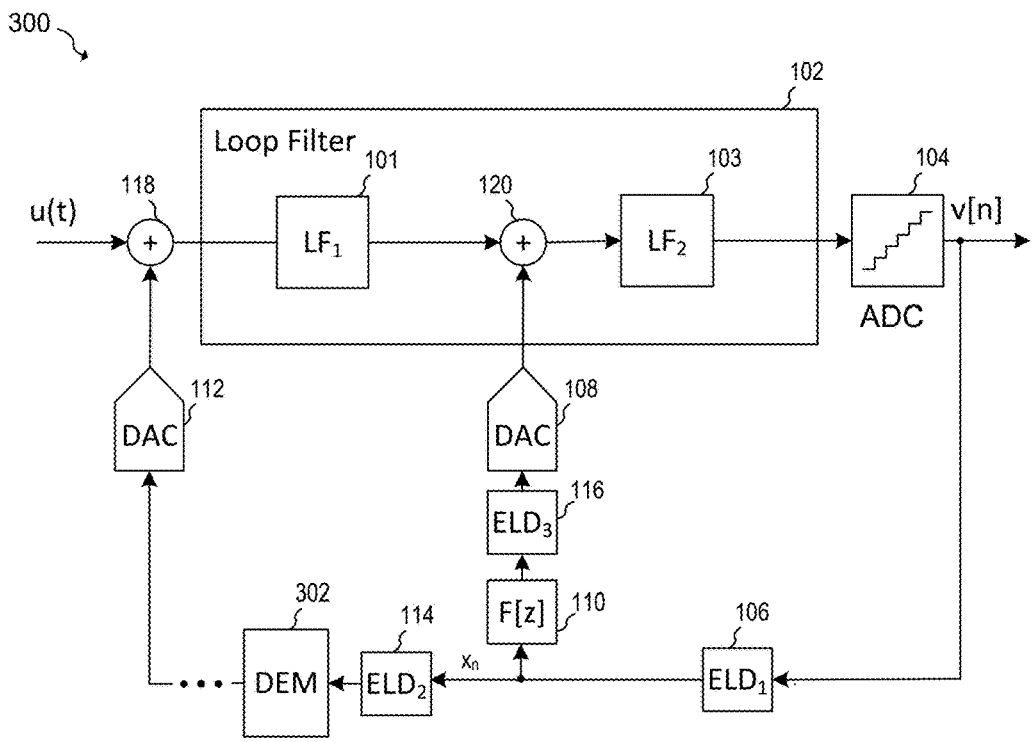
FIG. 3A illustrates an embodiment delta-sigma modulator having a dynamic element matching (DEM) circuit.

FIG. 3A illustrates an embodiment delta-sigma modulator 300 that includes dynamic element matching (DEM) circuit 302 coupled to DAC 112 in the outer loop. $ELD_2$ of block 114 represents the ELD of the outer loop segment that includes DEM circuit 302, DAC 112 and other circuitry that may be present in the outer loop segment.

Generally, the linearity of an outer feedback DAC, such as DAC 112 directly affects the linearity of delta-sigma modulator 300. This is because the nonlinearity of DAC 112 is not shaped by loop filter 102. However, because it is possible to compensate for ELD in the outer loop according to embodiments of the present invention, various types of DEM circuits can be added to improve the linearity of DAC 112. In various embodiments, DEM circuit 302 randomizes the reference elements in DAC 112. Thus, any static nonlinearities that would cause spurs, harmonic distortion or intermodulation distortion at the output of delta-sigma modulator v[n] are randomized, thereby transforming spurious energy into white noise. This allows DAC 112 to be implemented as a multi-bit DAC while maintaining a high degree of linearity.

Figure 3B:
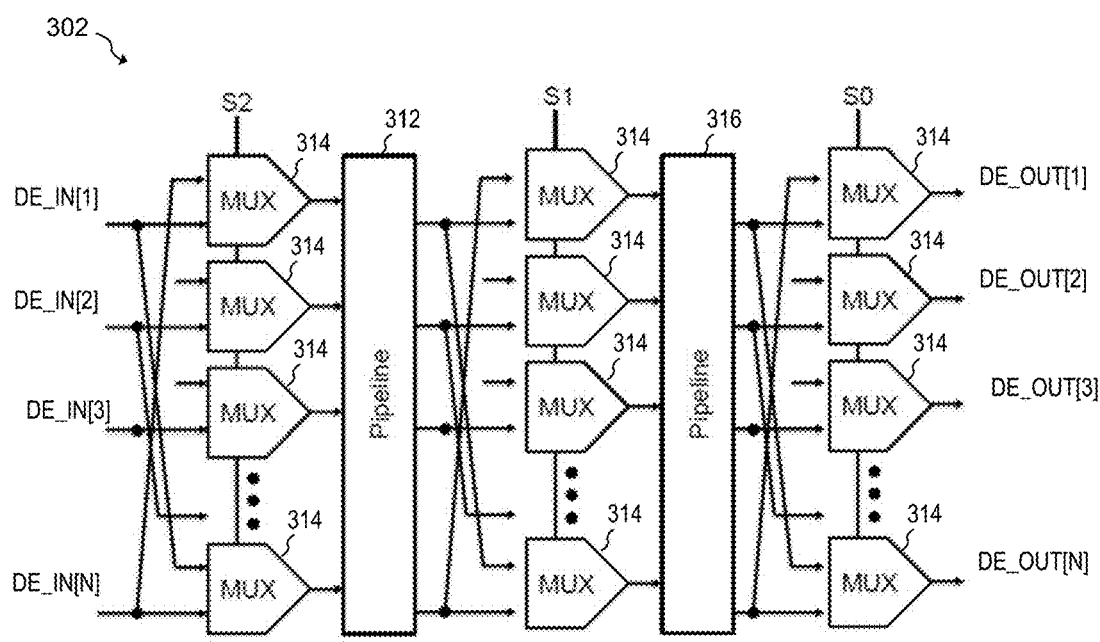
FIG. 3B illustrates a pipelined DEM circuit.

In one embodiment DEM circuit 302 may be implemented using a pipelined DEM circuit 302 shown in FIG. 3B. As shown DEM circuit 302 includes two pipeline stages 312 and 316 and three columns of multiplexers 314. During operation, the input word DE_IN[1:N] representing a thermometer coded DAC input is "scrambled" according to select signal S2. In other words, each bit of input word DE_IN[1:N] is stored in a selected register location of first pipeline stage 312 according to select signal S2 via respective multiplexers 314. In some embodiments the selected register location is chosen on a pseudo-random basis. The output of pipeline stage 316 is again "scrambled" according to select signal S1 and stored in pipeline stage 316. The output of pipeline stage 316 is "scrambled" again according to select signal S0 to form output word DE_OUT[1:N]. It should be understood that pipelined DEM circuit 302 may include greater than two pipeline stages. The number of multiplexers in each column is dependent on the number of DAC reference elements in DAC 112.

In some embodiments, select signals S2, S1 and S0 are generated using a pseudorandom number generator, such as a linear feedback shift register (not shown). DEM circuit 302 may also include a binary-to-thermometer decoder or other decoding circuit to transform the output of quantizer 104 into a suitable code word that independently selects the reference elements of DAC 112.

Figure 3C:
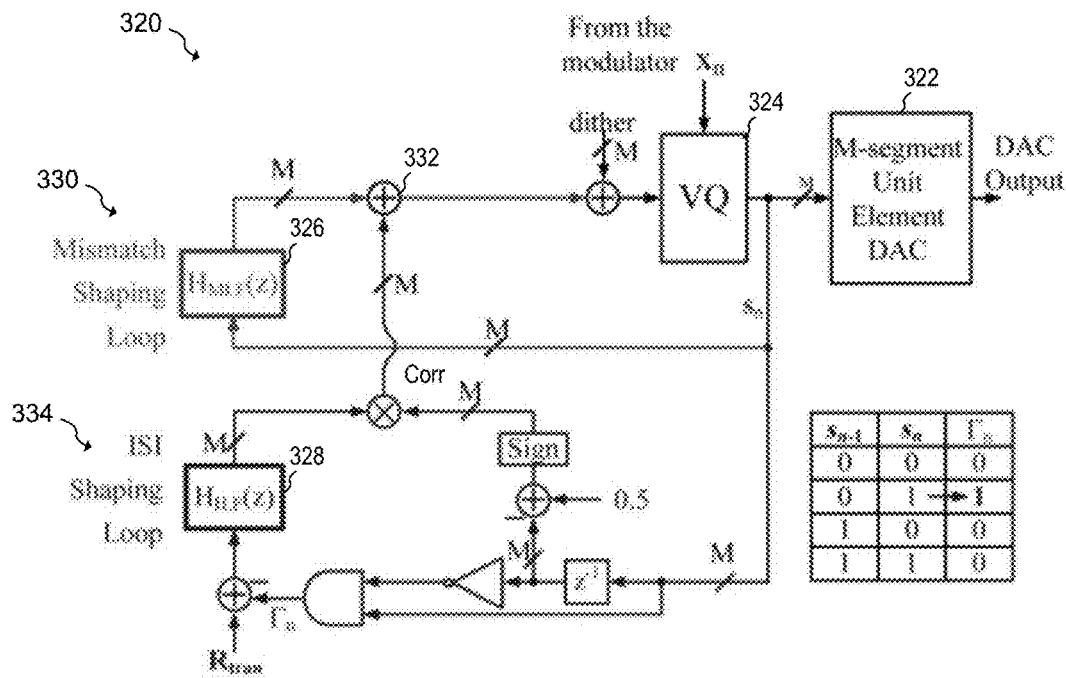
FIG. 3C illustrates a DEM circuit having a mismatch shaping loop and an intersymbol interference shaping loop.

In some embodiments, DEM circuit 302 of FIG. 3A may be implemented in other manners known in the art. For example, DEM may be implemented as DEM circuit 320 using a mismatch shaping loop 330 and an intersymbol interference (ISI) shaping loop 334 as shown in FIG. 3C and described in L. Risbo, R. Hezar, B. Kelleci, H. Kiper and M. Fares, "Digital Approaches to ISI-Mitigation in High-Resolution Oversampled Multi-Level D/A Converters," in IEEE Journal of Solid-State Circuits, vol. 46, no. 12, pp. 2892-2903, December 2011, which has been incorporated herein by reference. As shown, mismatch shaping loop 330 includes a vector quantizer 324 that produces a thermometer coded word $s_n$ based on DAC input $x_n$ and a dithered input signal. The output of vector quantizer 324 is coupled to the input of an M-segment unit element DAC. The dynamics of the mismatch shaping loop are shaped by loop filter 326.

ISI shaping loop 334 corrects for intersymbol interference in thermometer coded word M based on the value of thermometer coded word $s_n$, and therefore functions as an intersymbol interference correction circuit. Transitions of thermometer coded word $s_n$ are detected and a correction signal Corr is derived using ISI loop filter 328 and the other depicted components. Correction signal Corr is added to the input of vector quantizer 324 via summer 332.

Figure 4:
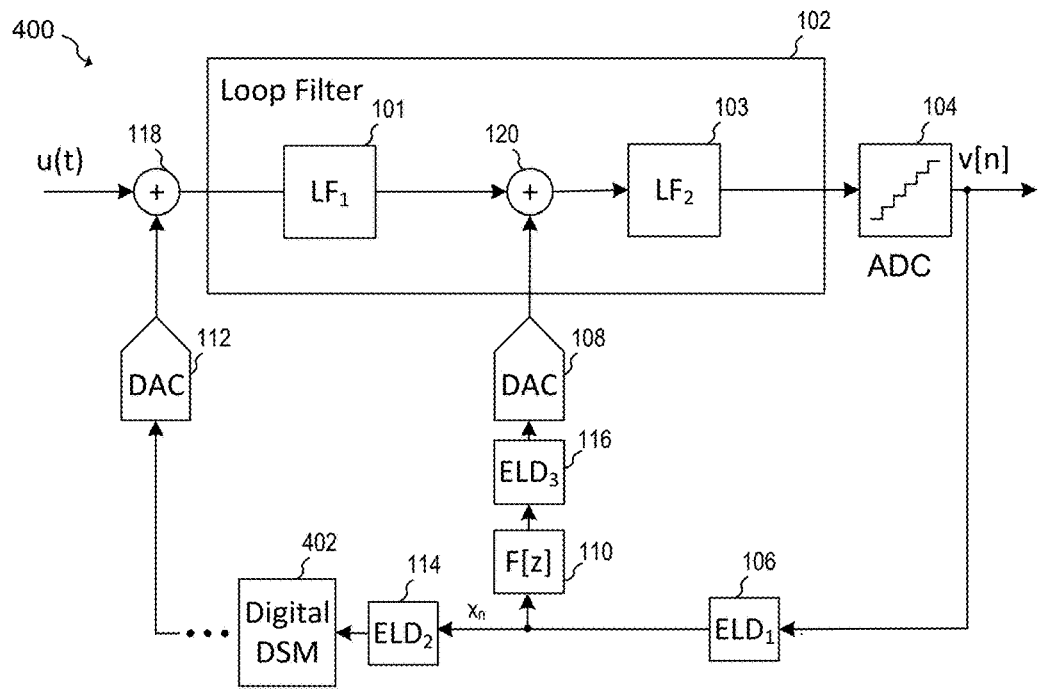
FIG. 4 illustrates a dual quantization delta-sigma modulator according to an embodiment.

FIG. 4 illustrates an embodiment dual quantization delta-sigma modulator 400 that includes a digital delta-sigma modulator 402 configured to convert a multi-bit output word $x_n$ of quantizer 104 to an oversampled DAC value of lower resolution. Because a delta-sigma modulator is used to perform the conversion, the quantization noise of DAC 112 is pushed to higher frequencies outside of the signal band of interest. In some embodiments, digital delta-sigma modulator 402 may be implemented as described in H. Pakniat and M. Yavari, "τΔ-FIR-DAC for Multi-Bit ΣΔ Modulators," in IEEE Transactions on Circuits and Systems I: Regular Papers, vol. 60, no. 9, pp. 2321-2332, September 2013, which has been incorporated herein by reference.

Figure 5:
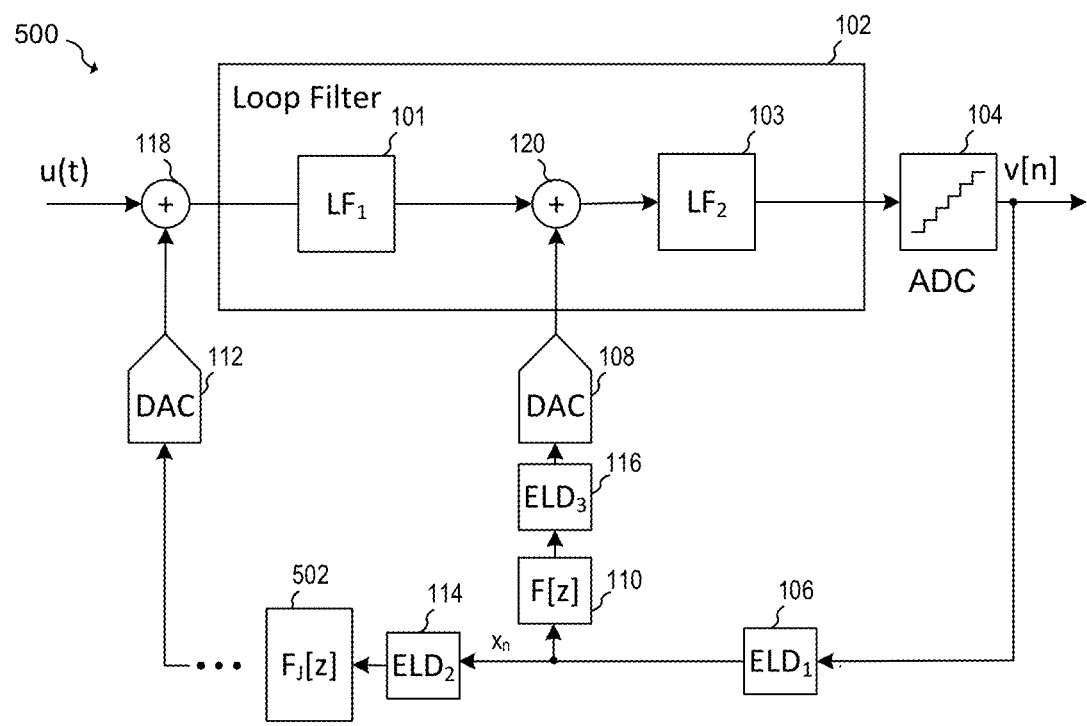
FIG. 5 illustrates an embodiment delta-sigma modulator that includes a jitter reduction filter.

Continuous-time delta-sigma modulators are sensitive to clock jitter. In some embodiments, a jitter reduction filter may be added to the outer feedback loop to perform jitter compensation. FIG. 5 illustrates an embodiment delta-sigma modulator 500 that includes a jitter reduction filter 502 in the outer feedback loop that is configured to reduce the sensitivity of the delta-sigma modulator to clock jitter. Jitter reduction filter 502 may be implemented as a FIR filter with a transfer function $F_j[z]$. The filter may be implemented, for example, as described in O. Oliaei, "Sigma-delta modulator with spectrally shaped feedback," in IEEE Transactions on Circuits and Systems II: Analog and Digital Signal Processing, vol. 50, no. 9, pp. 518-530, September 2003, which has been incorporated herein by reference. The additional ELD of jitter reduction filter 502 is compensated via compensation filter 110 as described in embodiments above.

Figure 6A:
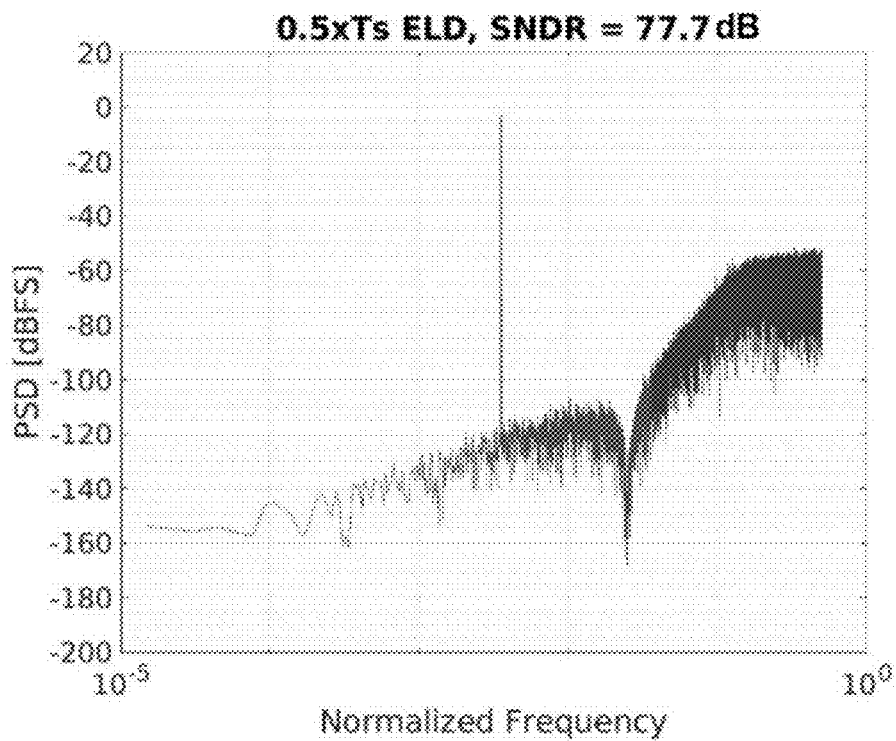
FIGS. 6A, 6B and 6C illustrate graphs showing the performance of an embodiment delta-sigma modulator.
Figure 6B:
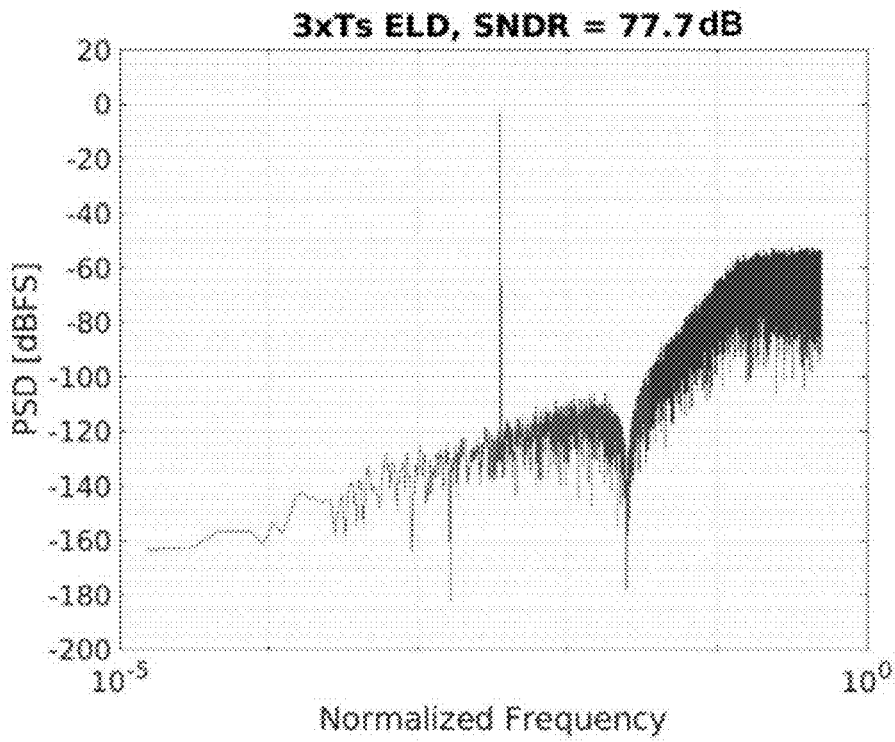
Figure 6C:
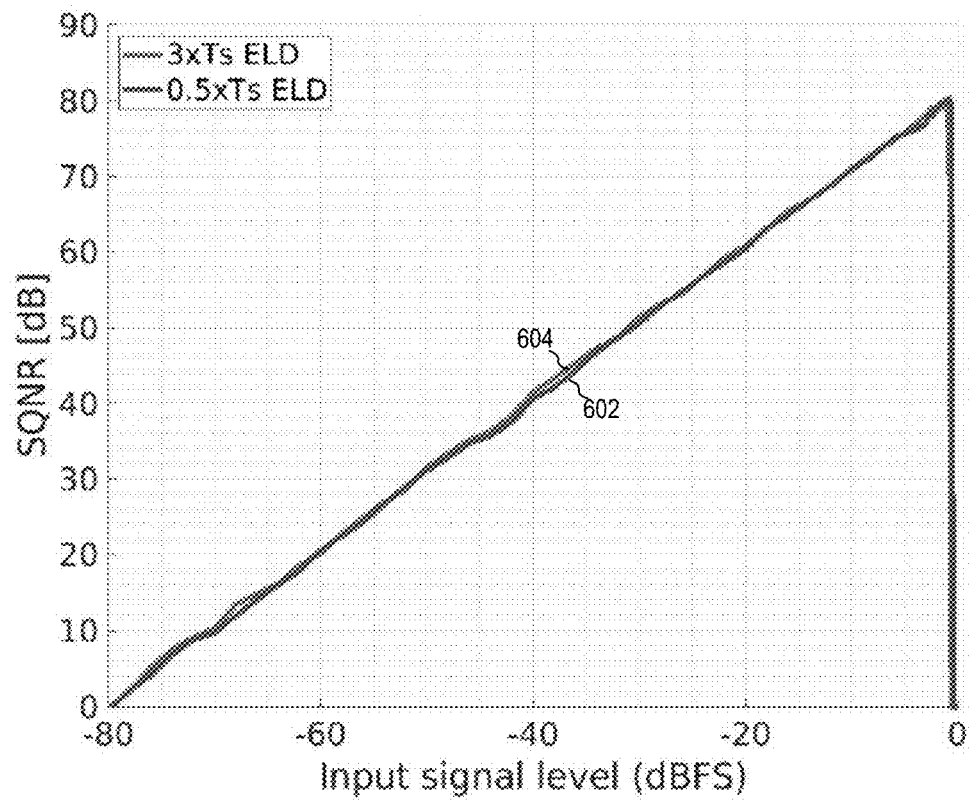

FIGS. 6A-6C illustrate graphs showing the performance of the embodiment delta-sigma modulator described above with respect to FIG. 2D, where quantizer 104 is implemented as a four-bit quantizer. FIG. 6A illustrates an output spectrum of the modulator with a sinusoidal input, where the sum of $ELD_1$ and $ELD_2$ is set to one-half of a clock cycle, and FIG. 6B illustrates the output spectrum of the modulator under similar input conditions where $ELD_1$ is set to a half of a clock cycle and $ELD_2$ is set to three clock cycles and compensation filter 110 is configured to compensate for $ELD_1$ and $ELD_2$. It can be seen that the SNDR for both cases is 77.7 dB and both graphs have similar noise floors. Thus, the use of compensation filter 110 is effective in compensating the potentially degrading effects of higher ELD on the noise transfer function of the delta-sigma modulator.

FIG. 6C illustrates a plot of SNQR with respect to input signal level for the delta-sigma modulator of FIG. 2D. Trace 602 represents the SNQR of the modulator where a sum of $ELD_1$ and $ELD_2$ is set to one-half of a clock cycle, and trace 604 represents the SNQR of the modulator where $ELD_1$ is set to a half of a clock cycle and $ELD_2$ is set to three clock cycles and compensation filter 110 is configured to compensate for $ELD_1$ and $ELD_2$. It can be seen from the graph of FIG. 6C that the SNQR performance of both cases is virtually identical. It can also be seen that both modulators in both cases achieve the same maximum stable amplitude (MSA), and that the modulator's stability is not affected or degraded due by using embodiment ELD compensation techniques.

Figure 7:
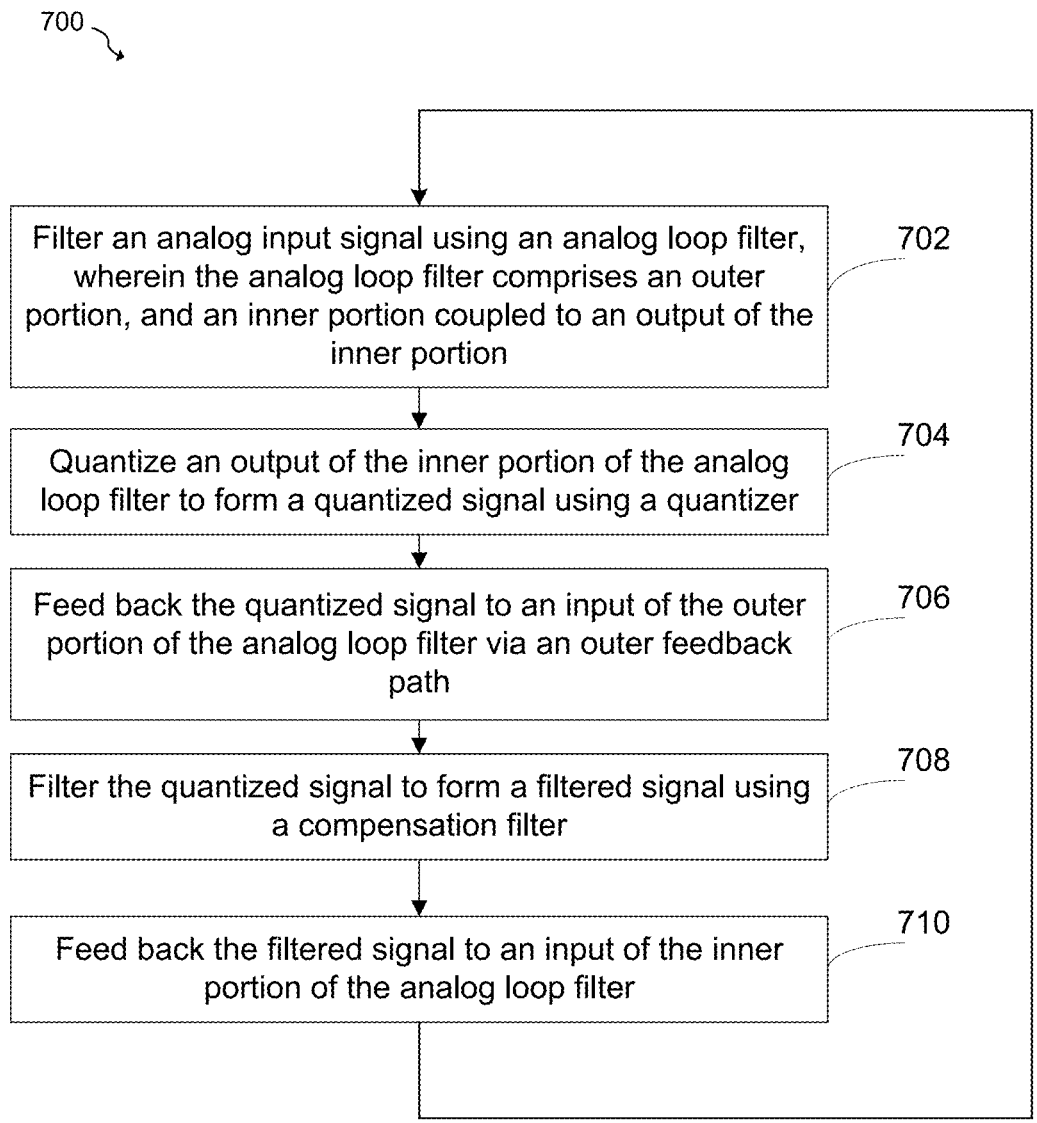
FIG. 7 illustrates flowchart of a method of operating an embodiment delta-sigma modulator.

FIG. 7 illustrates a method 700 of operating an embodiment delta-sigma modulator, such as the delta-sigma modulators described with respect to embodiments above. In step 702, an analog input signal is filtered using an analog loop filter that includes an outer portion, and an inner portion coupled to an output of the inner portion. The loop filter may be implemented using a continuous-time loop filter or a discrete-time loop filter.

In step 704, an output of the inner portion of the analog loop filter is quantized to form a quantized signal using a quantizer, which may be a single-bit quantizer or a multi-bit quantizer.

In step 706, the quantized signal is fed back to an input of the outer portion of the analog loop filter via an outer feedback path. The outer feedback path may include, for example, one or more outer feedback paths, corresponding DACs, and other circuitry such as a DEM circuit, a digital delta-sigma converter, a jitter reduction filter, an ISI filter or other circuitry.

In step 708, the quantized signal is filtered to form a filtered signal using a compensation filter, and in step 710, the filtered signal is fed back to an input of the inner portion of the analog loop filter. It should be understood that steps 702, 704, 706, 708 and 710 may be performed simultaneously in an ongoing fashion during operation of the embodiment delta-sigma modulator.

The compensation filter has a transfer function configured to correct for an effect of an outer excess loop delay (ELD) and an inner ELD on the delta-sigma modulator. The outer ELD includes a delay from the input of the quantizer to the input of the outer portion of the analog loop filter including the outer feedback path, and the inner ELD includes a delay from the input to the quantizer to the input of the inner portion of the analog loop filter including at least a portion of the outer feedback path. In various embodiments, the inner ELD is less than one clock cycle of the delta-sigma modulator, and the outer ELD is at least two clock cycles of the delta-sigma modulator.

Embodiments of the present invention are summarized here. Other embodiments can also be understood from the entirety of the specification and the claims filed herein.

Example 1. A delta-sigma modulator including: an analog loop filter including an outer portion and an inner portion having an input coupled to the outer portion; a quantizer coupled to an output of the inner portion of the analog loop filter; an outer feedback path coupled between an output of the quantizer and an input to the outer portion of the analog loop filter; and a compensation filter coupled between an output of the quantizer and an input of the inner portion of the analog loop filter, where: the compensation filter has a transfer function configured to correct for an effect of an outer excess loop delay (ELD) and an inner ELD on the delta-sigma modulator, the outer ELD includes a delay from the input of the quantizer to the input of the outer portion of the analog loop filter including the outer feedback path, and the inner ELD includes a delay from the input to the quantizer to the input of the inner portion of the analog loop filter including at least a portion of the outer feedback path, the inner ELD is less than one clock cycle of the delta-sigma modulator, and the outer ELD is at least two clock cycles of the delta-sigma modulator.

Example 2. The delta-sigma modulator of example 1, where: the input of the inner portion of the analog loop filter includes one or more inputs; the delta-sigma modulator includes one or more inner feedback paths coupled between the output of the quantizer and respective ones of the one or more inputs of the inner portion of the analog loop filter; and the compensation filter is disposed within one of the one or more inner feedback paths.

Example 3. The delta-sigma modulator of example 2, where the one or more inner feedback paths includes an innermost feedback path coupled to a last input of the inner portion of the analog loop filter, where a portion of the inner portion of the analog loop filter disposed between the last input of the inner portion of the analog loop filter and the output of the inner portion of the analog loop filter has an order of zero.

Example 4. The delta-sigma modulator of example 2 or 3, where: the one or more inner feedback paths includes a first digital-to-analog converter (DAC); the outer feedback path includes a functional circuit coupled to a second DAC; and the compensation filter includes a finite impulse response (FIR) filter.

Example 5. The delta-sigma modulator of one of examples 1 to 4, further including a functional circuit disposed within the outer feedback path.

Example 6. The delta-sigma modulator of example 5, where the functional circuit has a finite processing time and includes at least one of: a dynamic element matching (DEM) circuit; an inter-symbol interference (ISI) correction circuit; or a jitter reduction filter.

Example 7. The delta-sigma modulator of one of examples 1 to 6, where the transfer function of the compensation filter is configured to correct for an effect of the outer ELD and the inner ELD on a noise transfer function of the delta-sigma modulator.

Example 8. The delta-sigma modulator of one of examples 1 to 7, where the analog loop filter includes a cascade of integrators or resonators, where the cascade of resonators or integrators includes distributed feedback paths, feed-forward paths, or a combination of distributed feedback paths and feed-forward paths.

Example 9. A circuit including: a delta-sigma modulator including: an analog loop filter of order n including: a first analog loop filter portion having an order n1 of between 1 and p, where p is an integer of at least one and of at most n, and a second analog loop filter portion having an input coupled to an output of the first analog loop filter portion, the second analog loop filter portion having an order of p-n, a quantizer coupled to an output of the second analog loop filter portion, the quantizer having a first excess loop delay (ELD) and configured to provide a quantized sample every sampling period, an inner loop portion coupled between an output of the quantizer and an input of the second analog loop filter portion, the inner loop portion having an second ELD, the inner loop portion including a finite impulse response (FIR) filter and a first digital-to-analog converter (DAC) coupled between an output of the FIR filter and the input of the second analog loop filter portion, a functional circuit coupled between the output of the quantizer and an input of the first analog loop filter portion, and a second DAC having an input coupled to the output of the functional circuit and an output coupled to an input of the first analog loop filter portion, where the second DAC and the functional circuit have a third ELD, a sum of the first ELD and the second ELD is not larger than one clock cycle of the delta-sigma modulator, and the third ELD is larger than one clock cycle of the delta-sigma modulator, and where the FIR filter is configured to correct for an effect of the first ELD, the second ELD, and the third ELD on a noise transfer function of the delta-sigma modulator.

Example 10. The circuit of example 9, where a sum of the first ELD, the second ELD and the third ELD is greater than two sampling periods.

Example 11. The circuit of one of examples 9 or 10, where the functional circuit includes: a dynamic element matching circuit; a digital delta-sigma modulator; an intersymbol interference correction circuit; or a jitter reduction filter.

Example 12. The circuit of one of examples 9 to 11, further including a decimation filter coupled to an output of the quantizer.

Example 13. The circuit of one of examples 9 to 12, where: the input of the second analog loop filter portion of the analog loop filter includes a plurality of inputs; the inner loop portion includes a plurality of feedback loops coupled between the output of the quantizer and respective inputs of the plurality of inputs of the second analog loop filter portion.

Example 14. The circuit of one of examples 9 to 13, where: the first analog loop filter portion includes a first set of one or more integrators or resonators, where the first set includes distributed feedback paths, feed-forward paths, or a combination of distributed feedback paths and feed-forward paths; and the second analog loop filter portion includes a second set of one or more of integrators or resonators, where the second set includes distributed feedback paths, feed-forward paths, or a combination of distributed feedback paths and feed-forward paths.

Example 15. The circuit of one of examples 9 to 14, where the analog loop filter includes a continuous-time filter.

Example 16. A method of operating a delta-sigma modulator, the method including: filtering an analog input signal using an analog loop filter, where the analog loop filter includes an outer portion, and an inner portion coupled to an output of the inner portion; quantizing an output of the inner portion of the analog loop filter to form a quantized signal using a quantizer; feeding back the quantized signal to an input of the outer portion of the analog loop filter via an outer feedback path; filtering the quantized signal to form a filtered signal using a compensation filter; and feeding back the filtered signal to an input of the inner portion of the analog loop filter, where: the compensation filter has a transfer function configured to correct for an effect of an outer excess loop delay (ELD) and an inner ELD on the delta-sigma modulator, the outer ELD includes a delay from the input of the quantizer to the input of the outer portion of the analog loop filter including the outer feedback path, and the inner ELD includes a delay from the input to the quantizer to the input of the inner portion of the analog loop filter including at least a portion of the outer feedback path, the inner ELD is less than one clock cycle of the delta-sigma modulator, and the outer ELD is at least two clock cycles of the delta-sigma modulator.

Example 17. The method of example 16, the compensation filter includes finite impulse response (FIR).

Example 18. The method of one of examples 16 or 17, where feeding back the quantized signal to the input of the outer portion of the analog loop filter via the outer feedback path includes processing the quantized signal, and where processing the quantized signal includes at least one of: performing a dynamic element matching operation based on the quantized signal; correcting inter-symbol interference of the quantized signal; digitally delta-sigma modulating the quantized signal; or performing jitter compensation.

Example 19. The method of one of examples 16 to 18, further including: receiving the analog input signal at a signal input of the analog loop filter; and decimating the quantized signal using a decimation filter.

Example 20. The method of one of examples 16 to 19, where filtering the analog input signal using the analog loop filter includes using a continuous-time analog loop filter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A delta-sigma modulator comprising:
an analog loop filter comprising an outer portion and an inner portion having an input coupled to the outer portion;
a quantizer coupled to an output of the inner portion of the analog loop filter;
an outer feedback path coupled between an output of the quantizer and an input of the outer portion of the analog loop filter; and
a compensation filter coupled between an output of the quantizer and an input of the inner portion of the analog loop filter, wherein:
the compensation filter has a transfer function configured to correct for an effect of an outer excess loop delay (ELD) and an inner ELD on the delta-sigma modulator,
the outer ELD comprises a delay from the input of the quantizer to the input of the outer portion of the analog loop filter including the outer feedback path, and the inner ELD comprises a delay from the input to the quantizer to the input of the inner portion of the analog loop filter including at least a portion of the outer feedback path,
the inner ELD is less than one clock cycle of the delta-sigma modulator, and
the outer ELD is at least two clock cycles of the delta-sigma modulator.

2. The delta-sigma modulator of claim 1, wherein:
the input of the inner portion of the analog loop filter comprises one or more inputs;
the delta-sigma modulator comprises one or more inner feedback paths coupled between the output of the quantizer and respective ones of the one or more inputs of the inner portion of the analog loop filter; and
the compensation filter is disposed within one of the one or more inner feedback paths.

3. The delta-sigma modulator of claim 2, wherein the one or more inner feedback paths comprises an innermost feedback path coupled to a last input of the inner portion of the analog loop filter, wherein a portion of the inner portion of the analog loop filter disposed between the last input of the inner portion of the analog loop filter and the output of the inner portion of the analog loop filter has an order of zero.

4. The delta-sigma modulator of claim 2, wherein:
the one or more inner feedback paths comprises a first digital-to-analog converter (DAC);
the outer feedback path comprises a functional circuit coupled to a second DAC; and
the compensation filter comprises a finite impulse response (FIR) filter.

5. The delta-sigma modulator of claim 1, further comprising a functional circuit disposed within the outer feedback path.

6. The delta-sigma modulator of claim 5, wherein the functional circuit has a finite processing time and comprises at least one of:
a dynamic element matching (DEM) circuit;
an inter-symbol interference (ISI) correction circuit; or
a jitter reduction filter.

7. The delta-sigma modulator of claim 1, wherein the transfer function of the compensation filter is configured to correct for an effect of the outer ELD and the inner ELD on a noise transfer function of the delta-sigma modulator.

8. The delta-sigma modulator of claim 1, wherein the analog loop filter comprises a cascade of integrators or resonators, wherein the cascade of resonators or integrators comprises distributed feedback paths, feed-forward paths, or a combination of distributed feedback paths and feed-forward paths.

9. A circuit comprising:
a delta-sigma modulator comprising:
an analog loop filter of order n comprising:
a first analog loop filter portion having an order n1 of between 1 and p, wherein p is an integer of at least one and of at most n, and
a second analog loop filter portion having an input coupled to an output of the first analog loop filter portion, the second analog loop filter portion having an order of p-n,
a quantizer coupled to an output of the second analog loop filter portion, the quantizer having a first excess loop delay (ELD) and configured to provide a quantized sample every sampling period,
an inner loop portion coupled between an output of the quantizer and an input of the second analog loop filter portion, the inner loop portion having a second ELD, the inner loop portion comprising a finite impulse response (FIR) filter and a first digital-to-analog converter (DAC) coupled between an output of the FIR filter and the input of the second analog loop filter portion,
a functional circuit coupled between the output of the quantizer and an input of the first analog loop filter portion, and
a second DAC having an input coupled to the output of the functional circuit and an output coupled to an input of the first analog loop filter portion, wherein the second DAC and the functional circuit have a third ELD, a sum of the first ELD and the second ELD is not larger than one clock cycle of the delta-sigma modulator, and the third ELD is larger than one clock cycle of the delta-sigma modulator, and wherein the FIR filter is configured to correct for an effect of the first ELD, the second ELD, and the third ELD on a noise transfer function of the delta-sigma modulator.

10. The circuit of claim 9, wherein a sum of the first ELD, the second ELD and the third ELD is greater than two sampling periods.

11. The circuit of claim 9, wherein the functional circuit comprises:
a dynamic element matching circuit;
a digital delta-sigma modulator;
an intersymbol interference correction circuit; or
a jitter reduction filter.

12. The circuit of claim 9, further comprising a decimation filter coupled to an output of the quantizer.

13. The circuit of claim 9, wherein:
the input of the second analog loop filter portion of the analog loop filter comprises a plurality of inputs; and the inner loop portion comprises a plurality of feedback loops coupled between the output of the quantizer and respective inputs of the plurality of inputs of the second analog loop filter portion.

14. The circuit of claim 9, wherein:
the first analog loop filter portion comprises a first set of one or more integrators or resonators, wherein the first set comprises distributed feedback paths, feed-forward paths, or a combination of distributed feedback paths and feed-forward paths; and
the second analog loop filter portion comprises a second set of one or more integrators or resonators, wherein the second set comprises distributed feedback paths, feed-forward paths, or a combination of distributed feedback paths and feed-forward paths.

15. The circuit of claim 9, wherein the analog loop filter comprises a continuous-time filter.

16. A method of operating a delta-sigma modulator, the method comprising:
filtering an analog input signal using an analog loop filter, wherein the analog loop filter comprises an outer portion, and an inner portion coupled to an output of the inner portion;
quantizing an output of the inner portion of the analog loop filter to form a quantized signal using a quantizer;
feeding back the quantized signal to an input of the outer portion of the analog loop filter via an outer feedback path;
filtering the quantized signal to form a filtered signal using a compensation filter; and
feeding back the filtered signal to an input of the inner portion of the analog loop filter, wherein:
the compensation filter has a transfer function configured to correct for an effect of an outer excess loop delay (ELD) and an inner ELD on the delta-sigma modulator,
the outer ELD comprises a delay from the input of the quantizer to the input of the outer portion of the analog loop filter including the outer feedback path, and the inner ELD comprises a delay from the input to the quantizer to the input of the inner portion of the analog loop filter including at least a portion of the outer feedback path,
the inner ELD is less than one clock cycle of the delta-sigma modulator, and
the outer ELD is at least two clock cycles of the delta-sigma modulator.

17. The method of claim 16, the compensation filter comprises a finite impulse response (FIR) filter.

18. The method of claim 16, wherein feeding back the quantized signal to the input of the outer portion of the analog loop filter via the outer feedback path comprises processing the quantized signal, and wherein processing the quantized signal comprises at least one of:
performing a dynamic element matching operation based on the quantized signal;
correcting inter-symbol interference of the quantized signal;
digitally delta-sigma modulating the quantized signal; or
performing jitter compensation.

19. The method of claim 16, further comprising:
receiving the analog input signal at a signal input of the analog loop filter; and
decimating the quantized signal using a decimation filter.

20. The method of claim 16, wherein filtering the analog input signal using the analog loop filter comprises using a continuous-time analog loop filter.

* * * * *